United States Patent [19]

Shafer

[11] Patent Number: 4,469,414
[45] Date of Patent: Sep. 4, 1984

[54] RESTRICTIVE OFF-AXIS FIELD OPTICAL SYSTEM

[75] Inventor: David R. Shafer, Fairfield, Conn.
[73] Assignee: The Perkin-Elmer Corporation, Norwalk, Conn.
[21] Appl. No.: 383,683
[22] Filed: Jun. 1, 1982
[51] Int. Cl.³ .............................. G02B 17/00
[52] U.S. Cl. ......................... 350/444; 350/505
[58] Field of Search ............ 350/443, 449, 444, 505
[56] References Cited
U.S. PATENT DOCUMENTS
4,293,186 10/1981 Offner ...................... 350/505

Primary Examiner—Bruce Y. Arnold
Assistant Examiner—P. M. Dzierzynski
Attorney, Agent, or Firm—Edwin T. Grimes; Thomas P. Murphy

[57] ABSTRACT

This invention is directed to a restricted off-axis field optical system having a broad spectral range, which first and second nearly concentric optical subsystems, said subsystems being constructed and arranged with respect to each other so that variation in performance of one subsystem with wavelength substantially balances that of the other. That is, the subsystems are constructed and arranged with respect to each other so that the sum of the refractive power is nearly zero and the sum of the reflective power is also nearly zero.

9 Claims, 7 Drawing Figures

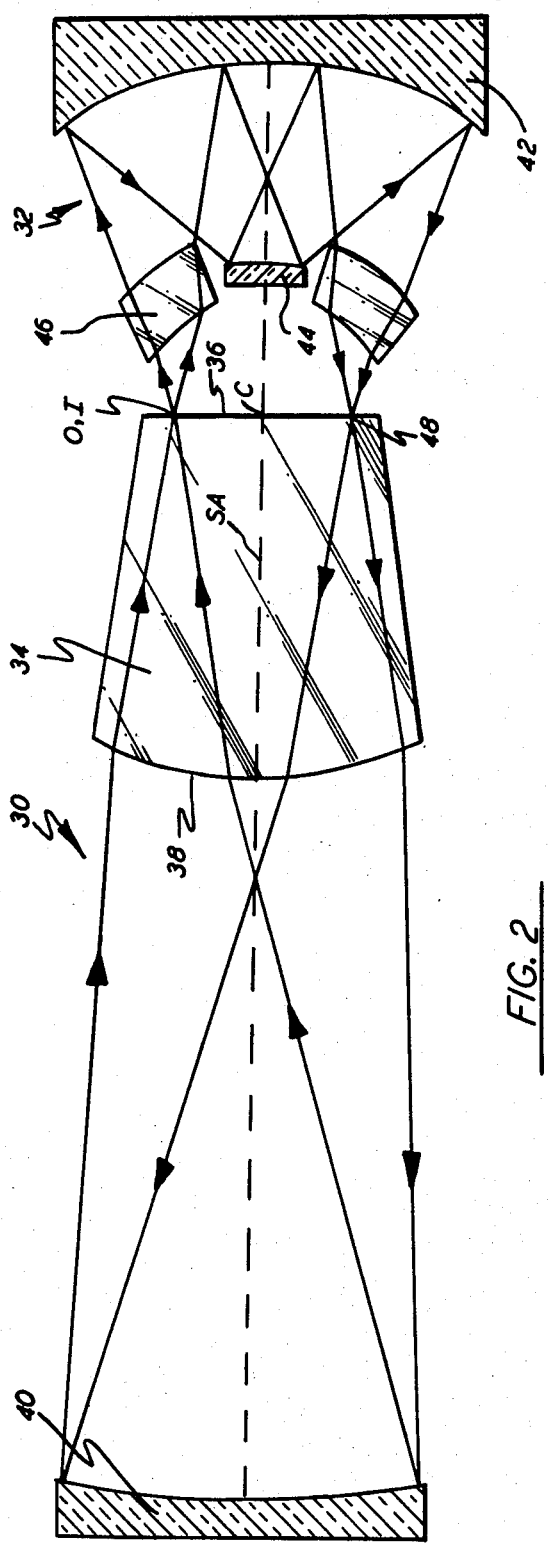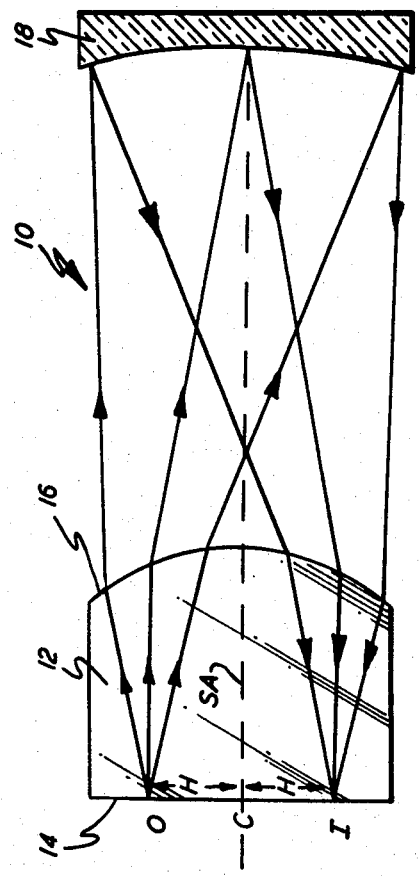
FIG. 1
FIG. 2

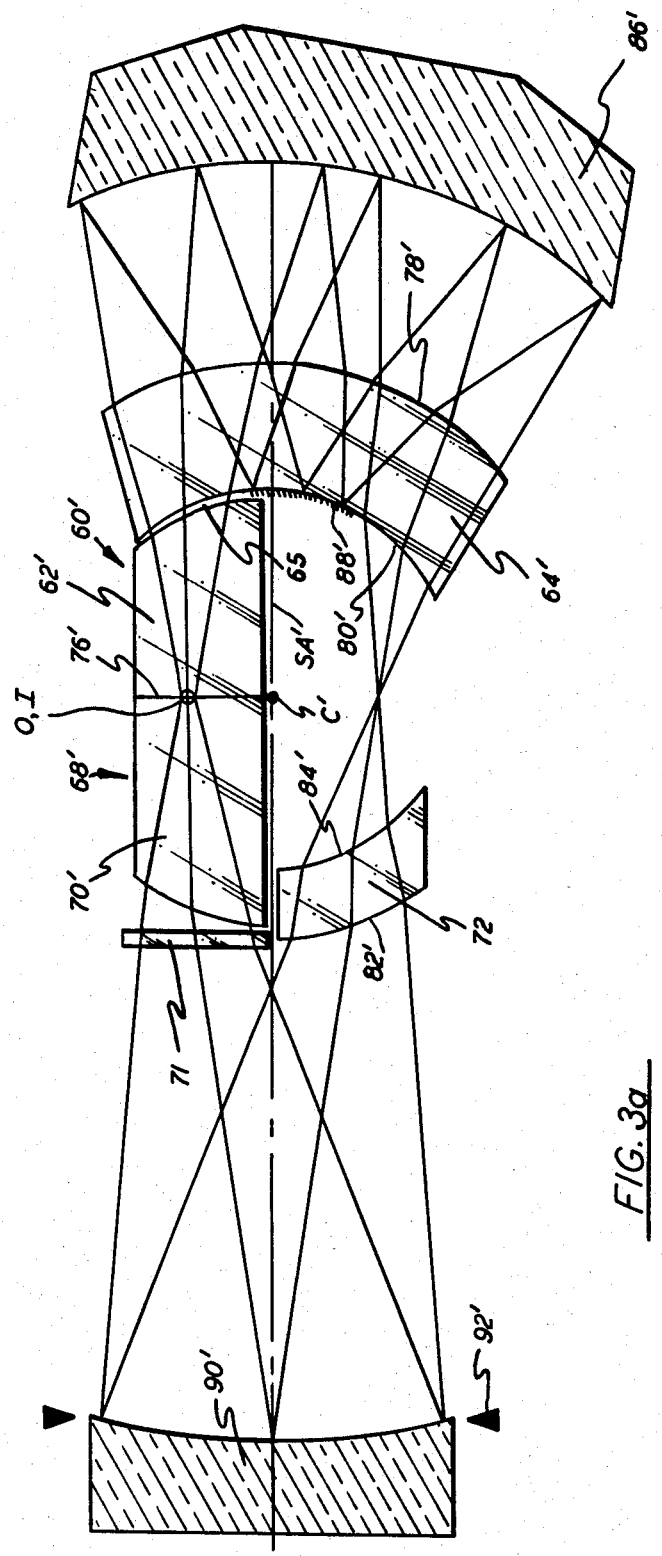

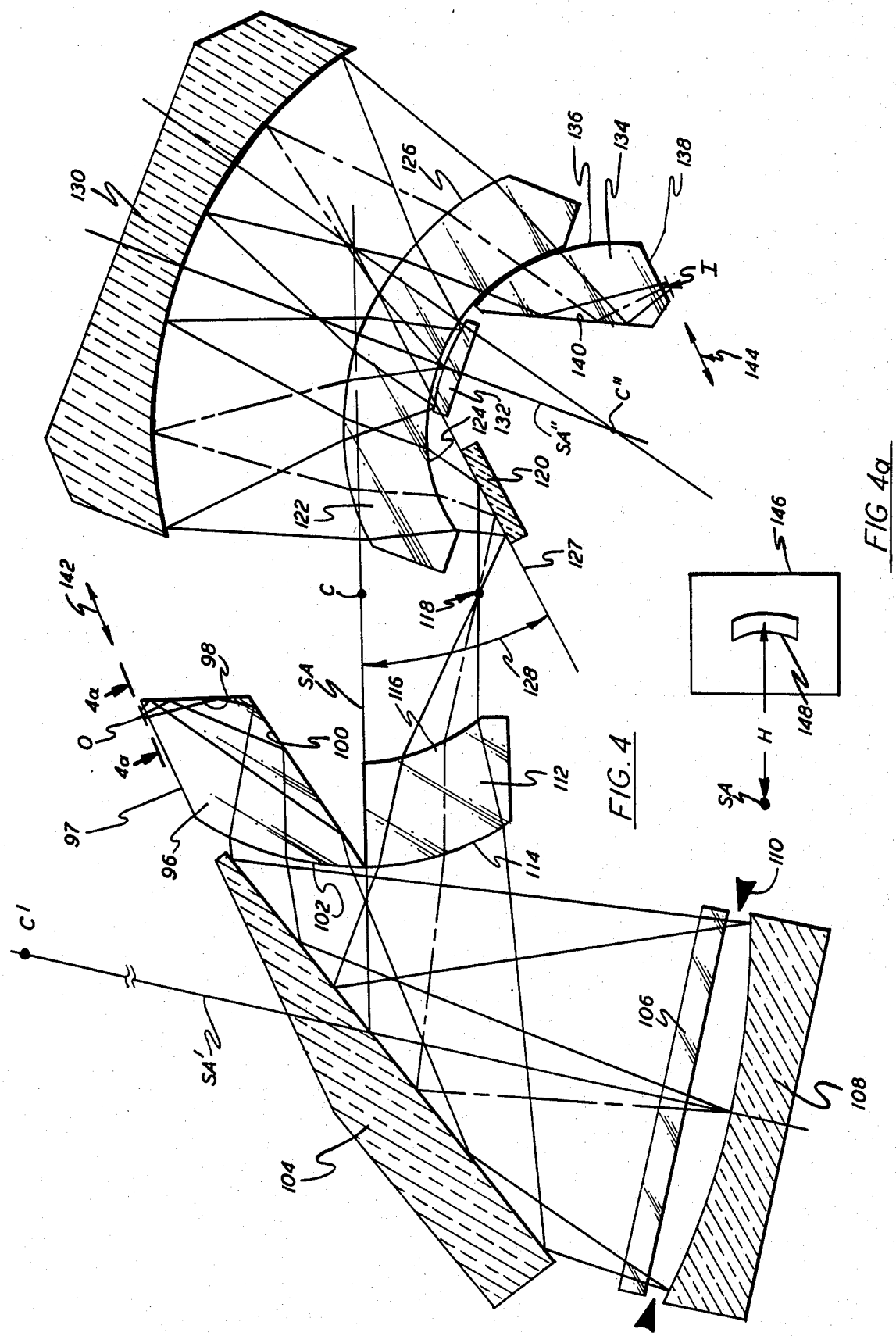

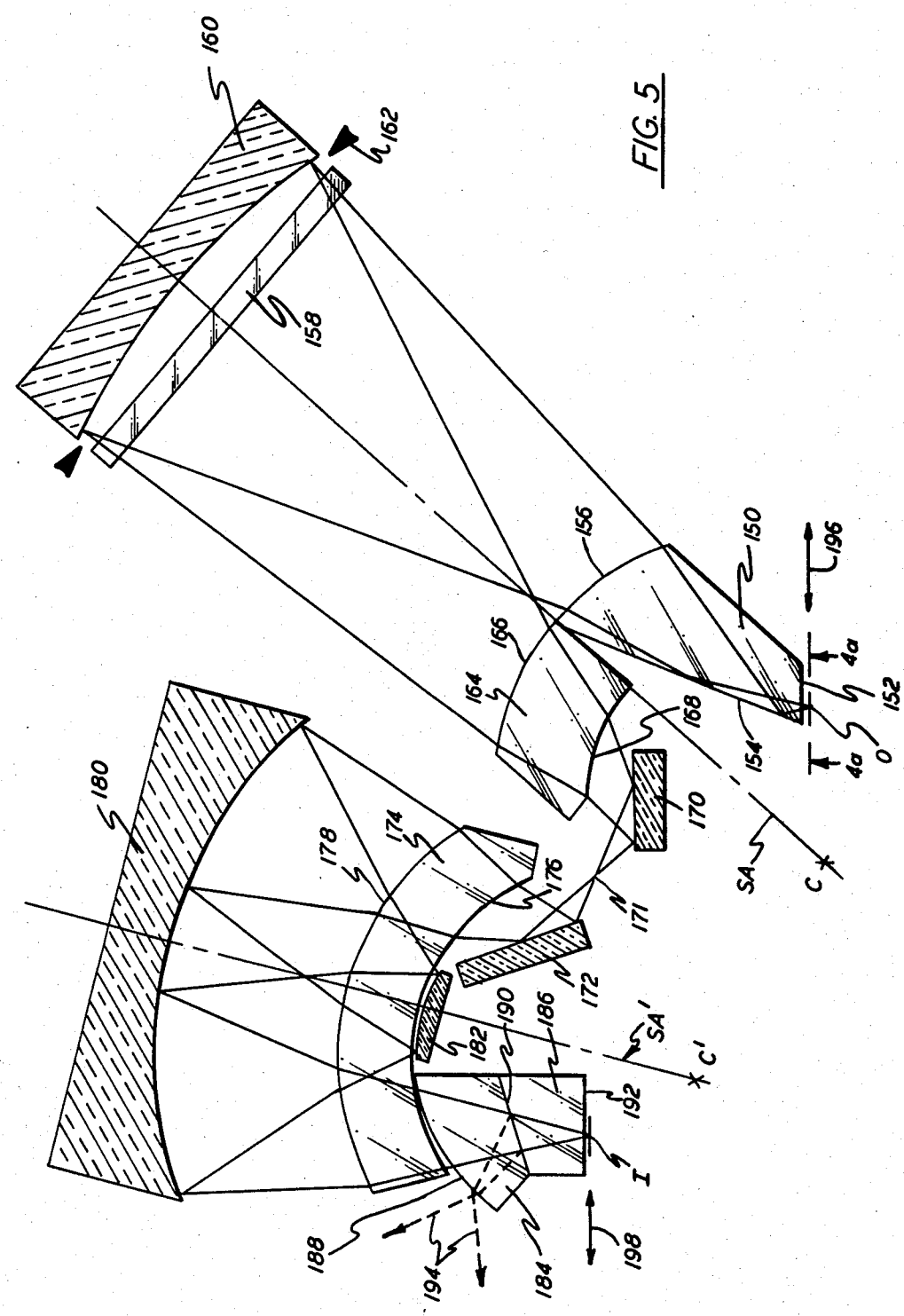

RESTRICTIVE OFF-AXIS FIELD OPTICAL SYSTEM

FIELD OF THE INVENTION

This invention relates to restricted off-axis field optical systems and, more particularly, to such a system having a broad spectral band. Optical systems constructed in accordance with the concepts of this invention are particularly adapted, among other possible uses, for effecting the exposure of photoresist-coated semiconductor wafers in the manufacture of integrated circuits.

BACKGROUND OF THE INVENTION

The present invention is related to the optical system disclosed by R. M. Scott in U.S. Pat. No. 3,821,763, and to the projection system disclosed in the A. Offner U.S. Pat. No. 3,748,015 both of which are assigned to the Assignee of the instant application, and the disclosures of which are incorporated by reference herein. The Scott Patent discloses a restricted off-axis field optical system in which an annular slit is used to restrict the field to an annular zone centered on the optical axis, and the system is optically corrected to preferentially increase image quality in the annular zone. The Offner Patent discloses a catoptric, off-axis annular field optical system for forming in accurate micro detail an image of an object at unit magnification with high resolution including convex and concave mirrors in face-to-face relationship with their centers of curvature being nearly concentric. The mirrors are arranged to produce at least three reflections within the system, and they are used in the system where there are axial conjugates at unit magnification in planes normal to the axis of the system.

Another high performance optical system having a broad spectral band is disclosed in the A. Hoffner Pat. No. 4,293,186, assigned to the Assignee of the instant application and the disclosure of which is incorporated by reference herein. This patent discloses a restricted off-axis field optical system, which includes refractive elements, having means for obtaining stigmatic imagery in the restricted off-axis field over an extended spectral range by balancing the chromatic variation in focus at the center of the restricted off-axis field due to the variation of field curvature with color by introducing axial color aberration of the opposite sense. In one form of the Offner system, two meniscus elements or shells are employed, in which one shell functions to improve the monochromatic performance and the other shell functions to correct the variation of performance with wavelength. This is done by letting at least one of the shells depart from concentricity. However, the departure of the shells from concentricity introduces higher order aberrations, which are not significant at a speed of f/3, but which could cause difficulties at faster speeds.

As is known from the publication entitled: "Achievements in Optics", by A. Bouwers, Elsevier Publishing Company, Inc., 1946, (particularly pages 24, 25 and 39,) and the article appearing in the Journal of The Optical Society of America, Vol. 34, No. 5, May 1944, pp. 270 to 284, entitled: "New Catadioptric Meniscus System", by D. D. Maksutov, meniscus elements can be used to reduce or remove the spherical aberration of principal rays parallel to the optical axis. Methods of correcting the axial longitudinal color aberration of said such systems are also described in these references.

Other related patents and publications in this field include Russian Pat. No. 126,911, issued Mar. 30, 1959; French Pat. No. 784,063, issued July 22, 1935; U.S. Pat. No. 3,244,073, issued Apr. 5, 1966; U.S. Pat. No. 3,821,763, issued June 28, 1974; U.S. Pat. No. 3,951,546, issued Apr. 20, 1976 and U.S. Pat. No. 4,011,011, issued Mar. 8, 1977, which is a continuation of U.S. Patent Application Ser. No. 339,860, filed Mar. 9, 1973 (now abandoned); "Unit Magnification Optical System without Seidel Aberrations", by J. Dyson, Journal of The Optical Society of America, Vol. 49, p. 713, 1959. (discussed more fully hereinafter).

It is noted that throughout the following specification and claims, statements made referring to an annular field of mean radius H also refer to a restricted off-axis field at a distance H from the axis. The terms color or chromatic variation as used herein is intended in its extended sense, i.e., it includes variation with wavelength in any region and is not restricted to visible light.

SUMMARY OF THE INVENTION

In order to accomplish the desired results, the invention provides a new and improved restricted off-axis field optical system having a broad spectral range comprising first and second substantially concentric optical subsystems. Said optical subsystems are constructed and arranged with respect to each other so that variation in performance of one subsystem with wavelength substantially balances that of the other. That is, the subsystems are constructed and arranged with respect to each other so that the sum of the refractive powers is nearly zero and the sum of the reflective powers is also nearly zero. The term "nearly zero" as used throughout the present specification and claims is intended to include optical systems having refractive and/or reflective powers which are exactly zero or as near zero as it is physically possible to make them as well as optical systems where the powers are close to exactly zero but purposely deviated slightly therefrom.

In some embodiments of the invention a little performance advantage is obtained in deviating slightly from perfect concentricity. The term "nearly concentric optical system" or "subsystem" as used in this specification and claims is intended to include optical systems which are perfectly concentric or as close to being perfectly concentric as it is possible to obtain physically, as well as optical systems which are close to being perfectly optically concentric but purposely deviated slightly therefrom. The term concentric as used herein is intended to mean optically concentric, whereas the centers could actually be physically spaced by means such as folding mirrors, for example. It is also noted, that in some embodiments flat plates, nearly flat plates, or the like, have been added, which could theoretically not be considered concentric elements because of their infinite radius. However, in the present specification and claims such elements may or may not be present in the system or subsystem which is called a "nearly concentric optical system" regardless of whether or not such element is positioned to pass through the optical center of curvature of the system.

In one form of the invention, one of the subsystems includes a combination of nearly concentric mirrors and a nearly concentric meniscus element, and the other subsystem includes a Dyson-like concentric system, and both of said subsystems have nearly the same center of curvature. In some embodiments, the Dyson-like subsystem is not a classical Dyson system, as the mirror and lens are not spaced according to Dyson. Nevertheless, the concept of a thick positive lens combined with a mirror is what is used.

It will be appreciated that both of said subsystems are independently well corrected. Each subsystem has good performance, but bad wavelength effects. That is, each subsystem is good by itself for one wavelength. The effect of wavelength is that the best focus shifts along axis somewhat like normal color, but it is not the normal color people think of with a simple lens that brings all of the light to the same focus. This is an off-axis phenomena as opposed to longitudinal color of a simple lens. This is a more complicated effect as it involves tangential and sagital rays. The sagital rays remain stationary, but the tangential rays go in and out of focus. The comparison between the tangential and sagital rays does shift along a line in the restricted off-axis field parallel to the optical axis. The Dyson-like subsystem has a positive lens power and shifts the focus one direction and the meniscus subassembly has a negative lens power and shifts the focus the opposite direction, thereby balancing each other.

Further, if the lenses of both subsystems can be considered separately as a group, i.e., the Dyson-like lens and the meniscus lens, the power of one lens is equal and opposite the power of the other lens. As a result, if the two lenses were placed next to each other a chief ray would go into one lens and out the other in parallel. It has been found that by constructing and arranging the system so that the chief ray passes through the meniscus lens, a plurality of times the meniscus element can be made thinner, because it is the total power that counts. Making this lens thinner improves the system's performance, and it also simplifies the physical locationing of the elements.

The meniscus lens corrects for spherical aberration of the chief ray, which is directly related to the fifth order astigmatism. It would be nice just to add the meniscus element, but unfortuntely it causes the aforementioned wavelength problems. The Dyson-like thick lens compensates for the wavelength problems, but adds a lot of spherical aberration of the chief ray. Actually, the Dyson-like thick lens corrects for the third order aberrations, but causes fifth order aberrations and chromatic aberrations. As a result, the meniscus lens not only has to correct for the mirrors in the system, but also corrects for the Dyson lens.

A feature of the new and improved catadioptric projection system according to the present invention resides in the provision of such a system, which is ideally suited for step and repeat projection as well as step and scan projection systems for small field microlithography.

Another feature of the present invention resides in the provision of a new catadioptric projection system wherein a f/1.5 design is quite practical, since higher-order aberrations are so small.

Still further features of the present invention reside in the provision of a new and improved restricted off-axis field optical system which may have no aspherics, no obscuration, no beamsplitters and only one glass type, fused silica. The system size is relatively small.

There has thus been outlined rather broadly the more important features of the invention in order that the detailed description thereof that follows may be better understood, and in order that the present contribution to the art may be better appreciated. There are, of course, additional features of the invention which will be described hereinafter and which will form the subject of the claims appended hereto. Those skilled in the art will appreciate that the conception upon which the disclosure is based may readily be utilized as a basis for the designing of other systems for carrying out the several purposes of the invention. It is important, therefore, that the claims be regarded as including such equivalent systems as do not depart from the spirit and scope of the invention.

Several embodiments of the invention have been chosen for purposes of illustration and description, and are shown in the accompanying drawings, forming a part of the specification.

BRIEF DESCRIPTION OF THE DRAWINGS

FIG. 1 is a schematic representation of a Dyson-type optical system, as known from the prior art;

FIG. 2 is a schematic representation of an optical system, constructed in accordance with the concepts of the present invention;

FIG. 3a is a schematic representation of another embodiment of an optical system according to the invention;

FIG. 4 is a schematic representation of still another embodiment of an optical system according to the present invention;

FIG. 4a is an enlarged view taken along the line 4a—4a of FIG. 4; and

FIG. 5 is a schematic representation of still a further embodiment of the invention.

DETAILED DESCRIPTION OF THE PREFERRED EMBODIMENTS

Figure 3:
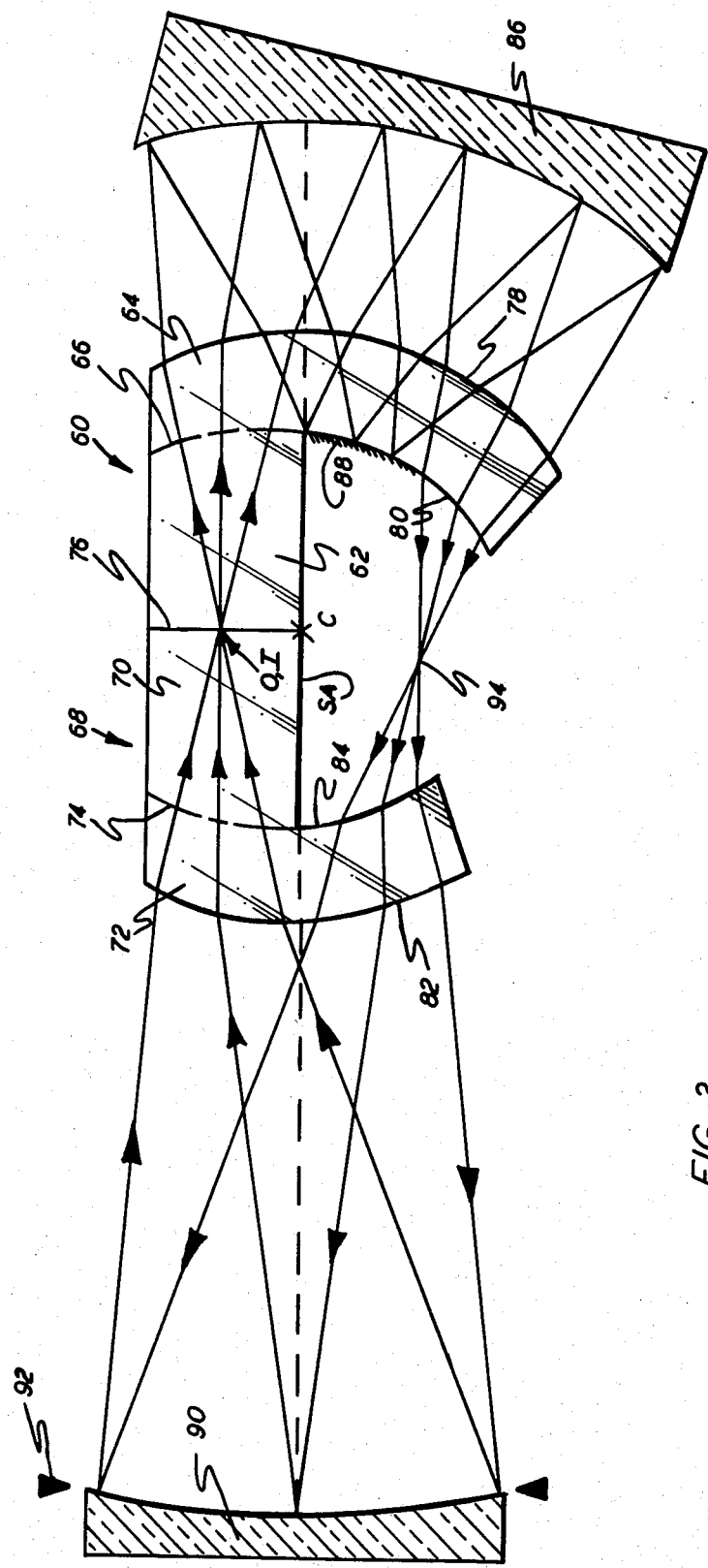
FIG. 3 is a schematic representation of another embodiment of an optical system constructed in accordance with the concepts of the present invention.

It will be appreciated that the restricted off-axis field optical system according to the present invention achieves high performance and a broad spectral range with a nearly completely concentric system. The key to its success is the combining of two separate nearly concentric designs, each with a narrow useful spectral band, such that the variation of performance of one system with wavelength, cancels or balances that of the other system. Heretofore, it was thought necessary to substantially depart from concentricity in order to achieve this goal, thereby introducing aberrations which limited the useful speed. However, according to the present invention this goal is achieved while holding nearly strict concentricity. The result is that a f/1.5 design is quite practical.

FIG. 1 shows a Dyson catadioptric system indicated generally at 10, which comprises a lens 12 having a planar first surface 14 and a spherical second surface 16. Further, the system includes a spherical mirror 18. The lens and mirror are arranged with their centers of curvature at C along the subsystem axis SA, and to have off-axis conjugate areas centered at an object point O and an image point I. The points O and I fall in an annulus centered on the reference axis SA spaced a distance H therefrom. The points O and I being on opposite sides of the axis. This is a nearly monocentric system with its center at C. It is noted that the radius of curvature of the lens is (n-1)/n times the radius of curvature of the mirror to give a Petzval sum of zero. The aperature stop is at the mirror 18, whereby the system is symmetrical and is automatically corrected for the three transverse aberrations. The seventh aberration, astigmatism, is zero near the middle of the field and the sagital field is flat, but the tangential field bends somewhat backwards at increasing distances from the axis.

In the embodiment of the invention shown in FIG. 2, a restricted off-axis field optical system according to the invention is shown, having a first nearly concentric Dyson-like subsystem, indicated generally at 30, and a second nearly concentric subsystem 32 of mirrors and a nearly concentric meniscus element. These subsystems are constructed and arranged so that the sum of the refractive power is nearly zero and the sum of the reflective power is also nearly zero, whereby variation of one of the subsystems with wavelength substantially balances that of the other. The nearly concentric Dyson-like subsystem 30 comprises a lens 34 having a planar surface 36 and a spherical surface 38 and a spherical mirror 40. The mirror 40 and lens 34 are arranged with their centers of curvature C coinciding along the system axis SA. The subsystem 32 comprises a primary concave spherical mirror 42, a secondary convex spherical mirror 44 and a nearly concentric meniscus element 46. These elements are so positioned that their centers of curvature nearly coincide at C on the optical axis SA. The radius of curvature of the secondary convex spherical mirror 44 is about one-half the radius of curvature of the primary concave spherical mirror 42. In this system the object and image locations coincide at O, I on the surface 36. An intermediate image, indicated at 48, is located on surface 36. The optical system of FIG. 2 has no third order or fifth order aberrations and no chromatic variation of the third order. Means may be employed for physically separating the object O and image I locations, if desired.

In some embodiments of the invention, a little performance advantage is obtained by deviating slighty from perfect concentricity. Referring next to the embodiment of FIG. 3, there is shown a first lens element indicated generally at 60 having a first portion 62 and a second portion 64 separated by a fictitious broken line 66. A second lens element, indicated generally at 68, has a first portion 70 and a second portion 72 separated by a fictitious broken line 74. The first portion 62 of lens 60 and the first portion 70 of lens 68 each having a first planar surface which coincides at 76. The second portion 64 of the first lens 60 has an outer convex, spherical surface 78 and an inner concave spherical surface 80, the center of curvature for both of which is at C on the system optical axis SA which it intersects the plane 76. The second portion 72 of the second lens 68 has an outer convex, spherical surface 82 and an inner concave spherical surface 84, the center of curvature for both of which is at C.

In addition, the system of FIG. 3 includes a spherical, concave mirror 86 positioned in spaced relationship with respect to the outer convex, spherical surface 78. The second portion 64 of the first lens 60 includes a convex, spherical mirror portion 88 on the inside of its inner spherical surface 80. The centers of curvature of the mirrors 86 and 88 also coincide at point C. A spherical concave mirror 90, having a center of curvature at C, is positioned in spaced relationship with respect to the outer convex spherical surface 82. This mirror acts as an aperture stop, as indicated at 92.

The first portion 62 of the first lens element 60, the first portion 70 of the second lens element 68, the mirror 90 and a portion of the mirror 86 coact to form a Dyson-like optical subsystem. This subsystem is not a classical Dyson system. Normally, the mirror is further away from the lens. Nevertheless, the concept of a thick positive lens combined with a mirror is what is used. The remainder of the optical elements illustrated in FIG. 3 form a second substantially concentric optical subsystem which is constructed and arranged with respect to said Dyson-like subsystem so that variation in performance of one subsystem with wavelength substantially balances that of the other. The sum of the refractive powers is nearly zero, and the sum of the reflective powers is also nearly zero.

In operation, light passes from the object location O through the first portion 62 and then through the second portion 64 of the first lens element 60 before it passes to the mirror 86 where it is reflected back through the second portion 64 to the mirror 88. Thence, the light is reflected by the mirror 88 back through the second portion 64 to the mirror 86 and again back through the second portion 64 through an intermediate image position indicated at 94 before it passes through the second portion 72 of the second lens element 68. Then the light passes to the mirror 90 where it is reflected back through the second portion 72 and the first portion 70 to the image location I, which optically coincides with the object location O at the planar surface 76. Means, if desired, may be employed for physically separating the object O and the image I locations. The optical system of FIG. 3 is well corrected and has substantially no third order or fifth order aberrations and substantially no chromatic variation of the third order.

The embodiment of FIG. 3a is generally similar to the embodiment of FIG. 3, and therefore, the corresponding elements in FIG. 3a are indicated by the same numerals as used in FIG. 3, but followed with a prime mark. However, some of the components in FIG. 3a are split into individual elements. Thus, first portion 62 of the first lens element 60 of FIG. 3 is a first lens member 62' and the second portion 64 is a second lens member 64'. The centers of curvature of the members 62' and 64' deviate slightly from concentricity, resulting in a small air gap 65 therebetween. This structure simplifies fabrication and adds performance advantage to the system. The first portion 70 of the second lens element of FIG. 3 is a third lens member 70' and the second portion 72 is a fourth lens member 72'. In addition, in the embodiment of FIG. 3a, a plane parallel or nearly plane-parallel thin flat plate 71 is mounted adjacent the lens member 70' for purposes of correcting for axial color and spherical aberration that are introduced when the object and image O and I are optically slightly removed from contact with the plane 76' between members 62' and 70'. Means, such as folding means, may be employed, if desired, for physically separating the object O and the image I locations.

The first lens member 62', the third member 70', the thin flat plate 71, the mirror 90', and a portion of the mirror 86' coact to form a Dyson-like optical subsystem. This subsystem is not a classical Dyson system, as normally the mirror is further away from the lens. The remainder of the optical elements illustrated in FIG. 3a form a second substantially concentric optical subsystem which is constructed and arranged with respect to the Dyson-like subsystem so that variation in performance of one subsystem with wavelength substantially balances that of the other. The sum of the refractive powers is nearly zero, and the sum of the reflective powers is also nearly zero. The optical system of this embodiment has substantially no third order or fifth order aberrations and substantially no chromatic variation of the third order.

A particularly desirable embodiment of the invention is illustrated in FIG. 4, which includes a first lens element 96 that receives light from an object O. Means are provided for mounting the object O adjacent to but very slighty spaced from the surface 97 of the lens 96. The lens element 96 has a first internal flat reflecting surface 98 and a second internal flat reflecting surface 100 for reflecting light from the object before it passes out through a spherical convex surface 102. The light thence passes to a flat folding mirror 104 and is reflected through a thin flat plane parallel plate or nearly plane parallel plate lens element 106 to a concave spherical mirror 108 disposed adjacent said flat plate. This plate corrects for the axial color and spherical aberration that are introduced when the object and image O and I are slightly removed from contact with the flat surfaces 138 and 142. It is very desirable to have this separation between I and O and the nearest optical surface. The mirror 108 acts as an aperture stop as indicated at 110. The light reflected by the concave mirror is returned through the flat plate lens element 106 back to the flat folding mirror 104, and thence through a convex-concave lens element 112, having a spherical convex surface 114 and a spherical concave surface 116. It will be appreciated that surfaces 102, 114 and 116 all have a common center of curvatures C located on the optical axis SA. The folding mirror 104 serves to rotate the optical axis from SA to SA' and, hence, rotates the center of curvature of the mirror 108 from the optical center C to the physical center C'.

The light passing through the lens element 112 passes through an intermediate image position indicated at 118 and thence to a folding mirror 120 from which it is reflected to a concave-convex spherical lens element 122, having a concave surface 124 and a convex surface 126. The plane 127 of the mirror 120 is disposed at an angle 128 of the order of about 27° with respect to the optical axis SA. The light passing through the lens 122 passes to a spherical concave mirror 130 where it is reflected back through the lens 122 to a spherical convex mirror 132. The light reflected from the mirror 132 again passes through the lens 122 back to the mirror 130 where it is reflected and passes back through the lens 122 one more time. From the lens 122 the light passes through a convex-plano lens 134 and focuses on an image location I. Lens 134 has a convex surface 136, a plane surface 138 and an internal reflective surface 140. The image receiving surface I is adjacent the plane surface 138, but spaced a slight distance therefrom.

In view of the folding mirror 120, the optical system axis SA is rotated to SA" so that the optical center of curvature C is rotated to the physical center of curvature C" on the axis SA", which is the center of curvature for the spherical surfaces 124, 126, 130, 132 and 136.

The lens element 96, the lens element 134 and the mirror 108 coact to form a Dyson-like subsystem. This subsystem is not a classical Dyson system but, nevertheless, incorporates a concentric thick positive lens combined with a mirror. The other optical elements in the embodiment of FIG. 4 form a second concentric optical subsystem which is constructed and arranged with respect to said Dyson-like subsystem so that variation and performance of one subsystem with wavelength substantially balances that of the other. The sum of the reflective powers is nearly zero and the sum of the refractive powers is also nearly zero. That is, these summations could be zero or as close to zero as it is physically possible to make them, or they could be nearly zero, but purposely slightly deviated therefrom.

For purposes of microlithography of the type using step and repeat, or scanning or step and scanning systems, the object O and image I may be moved as indicated by arrows 142 and 144.

Another particularly desirable embodiment of the invention is illustrated in FIG. 5, which includes a first lens element 150 that receives light from an object O. Means are provided for mounting the object O adjacent to but very slightly spaced from the surface 152 of the lens element 150. This lens element has a first internal flat reflecting surface 154 for reflecting light from the object before it passes out through a spherical convex surface 156. The light thence passes through a plane parallel or nearly plane parallel thin flat plate lens element 158 to a concave spherical mirror 160 disposed adjacent said flat plate. This plate corrects for the axial color and spherical aberrations that are introduced when the object and image O and I are slightly removed from contact with their adjacent flat surfaces. It is very desirable to have this separation between I and O and their nearest optical surface. The mirror 160 acts as an aperture stop, as indicated at 162. The light reflected by the concave mirror is returned through the flat plate lens element 158 and then through a convex-concave lens element 164, having a spherical convex surface 166 and a spherical concave surface 168. It will be appreciated that surfaces 156, 166, 168 and mirror 160 all have a nearly common center of curvature C located on or nearly on the optical axis SA.

The light passing through the lens element 164 passes to a first flat folding mirror 170 and is reflected through an intermediate image position indicated at 171, and thence to a second flat folding mirror 172 where it is reflected to a concave-convex spherical lens element 174, having a concave surface 176 and a convex surface 178. The folding mirrors 170 and 172 coact to rotate the optical axis from SA to SA' and, hence, rotates the center of curvature C to C'. The light passing through the lens element 174 passes to a spherical concave mirror 180 where it is reflected back through the lens 174 to a spherical convex mirror 182. The light reflected from the mirror 182 again passes through the lens 174 back to the mirror 180 where it is reflected and passes back through the lens 174 one more time. From the lens 174 the light passes through a convex-plano lens 184 and thence through a plate lens 186 and focuses on an image location I. The lens 184 has a convex spherical surface 188 and the plane surface thereof abuts one of the plane surfaces of lens 186, as indicated at 190. The other planar surface of lens 186 is indicated at 192. The two planar surfaces of lens 186 are not parallel with respect to each other. One of the surfaces as indicated at 190 forms, in effect, a beam splitter, whereby a portion of the beam is reflected as indicated by the broken lines 194 in FIG. 5, for purposes of alignment of the image with respect to the object. The image receiving surface I is adjacent the plane surface 192, but spaced a slight distance therefrom. In view of the folding lenses 170 and 172, the optical axis SA is rotated to SA', so that the optical center of curvature C is rotated to the center of curvature C' on the axis SA', which is the center of curvature for the spherical surfaces 176, 178 180 and mirrors 180 and 192.

The lens element 150, the lens elements 184 and 186 and the mirror 160 coact to form a Dyson-like subsystem. This subsystem is not a classical Dyson system but, does incorporate a nearly concentric thick positive lens combined with a mirror. The other optical elements shown in the embodiment of FIG. 5 form a second nearly concentric optical subsystem, which is constructed and arranged with respect to the Dyson-like subsystem so that variation in the performance of one subsystem with wavelength substantially balances that of the other. The sum of the reflective powers is nearly zero and the sum of the refractive powers is nearly zero. As indicated in connection with the embodiment of FIG. 4, these summations could be zero or as close to zero as it is possible to make them, or they could be nearly zero but purposely slightly deviated therefrom.

For purposes of microlithography of the type using step and repeat, or scanning, or step and scanning systems, the object O and the image I may be moved as indicated by arrows 196 and 198.

As indicated hereinbefore, the Dyson-like subsystem in effect corrects for the third order aberrations of the mirrors, but it introduces chromatic aberrations and fifth order aberrations. The remaining optical elements of the system, or shell subassembly, corrects for spherical aberration of the chief ray which is directly related to the fifth order astigmatism, while correcting for the aberrations introduced by the mirrors and Dyson lenses. As a result, the optical systems of FIGS. 4 and 5 are well corrected and are relatively free of third order or fifth order aberrations and are relatively free of chromatic variation of the third order.

FIG. 4a shows an example of one means for restricting the off-axis field. While this system is illustrated for application with the embodiments of FIGS. 4 and 5, it is likewise applicable to the other embodiments of the invention illustrated. As illustrated in FIG. 4a mask 146, containing a curved slit 148 of radius H is placed with its center of curvature at the optical axis SA, and in the object plane at O, as shown in FIGS. 4 and 5 so as to restrict the imagery to that portion of the object area which is exposed through the slit 148. That portion of the object area will be imaged stigmatically into a similar curved area in the image plane I. This comes about because all portions of the object and image that are in the slit, or in the image of the slit, are all at substantially the same distance H from the optical axis SA, at which the system is corrected. The mask 146 could be provided in the image plane at I, or a mask could be provided in each plane, or the mask could be so positioned that the image thereof is in the image plane I. Further, when the system is used for effecting the exposure of photoresist-coated semiconductor wafers in a scanning mode, or step and scan mode, the object such as a photographic transparency is moved past the slit 148 so that a substantially unit power image of that portion of the object exposed by the slit is formed at I and moves past I. As a result, if a wafer is placed at the image I and moved synchronously with the photographic transparency, it would be exposed to an image over the entire area.

The lenses described in the present specification may be fabricated from any suitable material such as, for example, fused silica.

Although specific embodiments have been illustrated and described, it will be obvious to those skilled in the art that various modifications may be made without departing from the spirit and scope of the invention, which is to be limited solely by the appended claims.

What is claimed is:

1. A restricted off-axis optical system having a broad spectral range, which includes refractive elements and reflective elements comprising:
   a first thick lens element having a first portion and a second portion;
   said first portion having an inner planar surface, said second portion having an outer convex spherical surface and an inner concave spherical surface, said second portion having an internal convex, spherical mirror portion on the internal side of its inner spherical surface;
   a spherical concave mirror positioned in spaced relationship with respect to said outer convex spherical surface;
   a second thick lens element having a first portion and a second portion positioned in back-to-back relationship with respect to said first lens element; the first portion of the second lens having an inner planar surface, the second portion of the second lens having an outer convex spherical surface and an inner concave spherical surface;
   a second spherical concave mirror positioned in spaced relationship with respect to the outer convex spherical surface of the second portion of the second lens;
   all of said optical surfaces having nearly optically coincident centers of curvature; and
   the sum of the reflective powers of the optical elements being nearly zero and the sum of the refractive powers of the optical elements being nearly zero.

2. A restricted off-axis optical system having a broad spectral range, which includes refractive elements and reflective elements comprising:
   a first thick lens member having an inner planar surface and an outer convex spherical surface; a second lens member having an inner concave spherical surface and an outer convex spherical surface, said second lens member having an internal convex, spherical mirror portion on the internal side of its inner spherical surface;
   a spherical concave mirror positioned in spaced relationship with respect to said outer convex spherical surface of said second lens member;
   a third thick lens member positioned in back-to-back relationship with respect to said first lens member; the third lens member having an inner planar surface and an outer convex spherical surface, a fourth lens member having an outer convex spherical surface and an inner concave spherical surface;
   a thin plane parallel or nearly plane parallel plate lens element positioned adjacent the outer surface of said third lens member;
   a second spherical concave mirror positioned in spaced relationship with respect to the outer convex spherical surface of the fourth member and with respect to said thin flat plate;
   all of said optical surfaces having nearly optically coincident centers of curvature; and
   the sum of the reflective powers of the optical elements being nearly zero and the sum of the refractive powers of the optical elements being nearly zero.

3. A restrictive off-axis field optical system having a broad spectral range, which includes refractive elements and reflective elements comprising:

- a first thick plano-convex lens element having a first planar surface and a second convex spherical surface, said lens being positioned for receiving light from an object location adjacent said first planar surface;
- a first folding mirror disposed in spaced relationship with respect to said second convex spherical surface for receiving light therefrom;
- a thin plate positioned in spaced relationship with respect to said first folding mirror for receiving reflected light therefrom;
- a first concave spherical mirror positioned adjacent said thin plate for receiving light from the plate and reflecting it back through the same plate to said first folding mirror;
- a second concave-convex spherical lens element for receiving light reflected from said first folding mirror and positioned in spaced relationship thereto;
- a second folding mirror positioned in spaced relationship and in light receiving attitude with respect to said second lens element, said system being so arranged that there is an intermediate image point disposed between said second lens element and said second folding mirror;
- a third concave-convex spherical lens element for receiving light from said second folding mirror and being positioned in spaced relationship with respect thereto;
- a second concave spherical mirror positioned for receiving light from said third lens element and in spaced relationship thereto;
- a convex spherical mirror positioned closely adjacent the concave surface of said third lens element for receiving light reflected by said second concave spherical mirror after it has passed a second time through said third lens element, said convex spherical mirror and said third lens element and said second concave spherical mirror being so positioned with respect to each other that light reflected from said convex spherical mirror passes through the third lens element a third time and is reflected from the second concave mirror a second time and then passes through the third lens element a fourth time;
- a fourth thick convex-plano lens element having a first convex spherical surface and a second planar surface, said fourth lens element being positioned closely adjacent the concave surface of said third lens element for receiving light from said third lens element and for focusing the light at an image location closely adjacent the second planar surface of the fourth lens element;
- said lens elements and mirrors being constructed and arranged to be nearly optically concentric with the centers of curvature being physically spaced by said folding mirrors;
- the sum of the refractive powers of the optical elements being nearly zero and the sum of the reflective powers of the optical elements being nearly zero.

4. A restrictive off-axis field optical system having a broad spectral range, which includes refractive elements and reflective elements comprising:

- a first, thick plano-convex lens element having a first planar surface and a second convex spherical surface, said lens being positioned for receiving light from an object location adjacent said first planar surface;
- a thin plate positioned in spaced relationship with respect to said second convex spherical surface for receiving light therefrom;
- a first concave spherical mirror positioned adjacent said thin plate for receiving light from the plate and reflecting it back through the same plate;
- a second, concave-convex spherical lens element for receiving light reflected back through said thin plate and positioned in spaced relationship with respect thereto;
- a first folding mirror positioned in spaced relationship and in light receiving attitude with respect to said second lens element;
- a second folding mirror positioned in spaced relationship and in light receiving attitude with respect to said first folding mirror, said system being so arranged that there is an intermediate image point disposed between said first folding mirror and said second folding mirror;
- a third, concave-convex spherical lens element for receiving light from said second folding mirror and being positioned in spaced relationship with respect thereto;
- a second concave spherical mirror positioned for receiving light from said third lens element and in spaced relationship thereto and reflecting it back through the same third lens element;
- a convex spherical mirror positioned closely adjacent the concave surface of said third lens element for receiving light reflected by said second concave spherical mirror after it has passed a second time through said third lens element, said convex spherical mirror and said third lens element and said second concave spherical mirror being so positioned with respect to each other that light reflected from said convex spherical mirror passes through the third lens element a third time and is reflected from the second concave mirror a second time and then passes through the third lens element a fourth time;
- a fourth, thick convex-plano lens element having a first convex spherical surface and a second planar surface, said fourth lens element being positioned closely adjacent the concave surface of said third lens element for receiving light from said third lens element;
- a fifth-plano lens element having two opposite non-parallel planar surfaces, one of which being disposed closely adjacent the planar surface of said fourth lens for receiving light from said fourth lens element and focusing the light at an image location closely adjacent the second planar surface of the fifth lens element;
- said lens elements and mirrors being constructed and arranged to be nearly optically concentric with the centers of curvature being physically spaced by said folding mirrors;
- the sum of the refractive powers of the optical elements being nearly zero and the sum of the reflective powers of the optical elements being nearly zero.

5. A restricted off-axis optical systems having a broad spectral range comprising, in combination:

spaced off-axis object and image locations for light to pass from the said object location through said system to said image location;

a first thick lens element positioned adjacent the object location for light to make one pass therethrough;

a nearly plane parallel plate element positioned for light to make two passes therethrough;

a first concave mirror element positioned to receive light from said first thick lens element to make one reflection therefrom;

a first meniscus element positioned for light reflected from said first concave mirror to make one pass therethrough;

a second meniscus element positioned to receive light from the first meniscus element and to make four passes therethrough;

a second concave mirror element positioned adjacent said second meniscus element for light to make two reflections therefrom;

a convex mirror element positioned on the opposite side of said second meniscus element as said second concave mirror for light to make one reflection therefrom;

a second thick lens element positioned for light to make one pass therethrough;

one group of said curved optical surfaces having nearly optically coincident centers of curvature and a second group having nearly optically coincident centers of curvature; and the sum of the reflective powers of the optical elements being nearly zero and the sum of the refractive powers of the optical elements being nearly zero.

6. A restricted off-axis optical system according to claim 5 wherein said curved optical surfaces are spherical optical surfaces.

7. A restricted off-axis optical system according to claim 5 wherein said nearly optically coincident centers of curvature of said one group and for said second group are both at nearly the same location.

8. A restricted off-axis optical system according to claim 5 wherein each of said thick lens elements has one substantially flat surface and a second convex spherical surface.

9. A restricted off-axis optical system according to claim 8 wherein said image and object locations are disposed adjacent the flat surfaces of said thick lens elements respectively.

* * * * *